United States Patent [19]

Toukhy

[11] Patent Number: 5,254,440
[45] Date of Patent: Oct. 19, 1993

[54] SELECTED METHYLOL-SUBSTITUTED TRIHYDROXYBENZOPHENONES AND THEIR USE IN PHENOLIC RESIN COMPOSITIONS AND PROCESSES OF FORMING RESIST IMAGES

[75] Inventor: Medhat A. Toukhy, Barrington, R.I.
[73] Assignee: OCG Microelectronic Materials, Inc., Cheshire, Conn.
[21] Appl. No.: 953,381
[22] Filed: Sep. 30, 1992

Related U.S. Application Data

[62] Division of Ser. No. 654,841, Feb. 13, 1991, Pat. No. 5,177,172, which is a division of Ser. No. 200,676, May 31, 1988, Pat. No. 5,002,851.

[51] Int. Cl.$^5$ .................. G03F 7/32; G03F 7/023
[52] U.S. Cl. ............................. 430/326; 430/165; 430/191; 430/192; 430/193; 430/330; 525/503; 528/153; 528/155
[58] Field of Search ............... 430/326, 192, 191, 193, 430/165, 330; 525/503, 493; 528/153, 155

[56] References Cited

U.S. PATENT DOCUMENTS

| | | | |
|---|---|---|---|
| 3,288,880 | 11/1966 | Tocker | 528/127 |
| 3,390,127 | 6/1968 | Schick et al. | 528/127 |
| 4,275,139 | 6/1981 | Stahlhofen | 430/165 |
| 4,302,606 | 11/1981 | Barbaras et al. | 568/33 |
| 4,345,054 | 8/1982 | Takeda et al. | 525/503 |
| 4,377,631 | 3/1983 | Toukhy et al. | 430/165 |
| 4,387,152 | 6/1983 | Stahlhofen | 430/193 |
| 4,555,469 | 11/1985 | Erdmann et al. | 430/192 |
| 4,642,282 | 2/1987 | Stahlhofen | 430/192 |
| 4,699,867 | 10/1987 | Schneller et al. | 430/192 |
| 4,732,840 | 3/1988 | Hasegawa | 430/175 |
| 4,810,613 | 3/1989 | Osuch et al. | 430/193 |
| 4,837,121 | 6/1989 | Blakeney et al. | 430/192 |

FOREIGN PATENT DOCUMENTS 273026 6/1988 European Pat. Off.

OTHER PUBLICATIONS

Noller, Carl R. Textbook of Organic Chemistry, W. B. Saunders Co., 1953, p. 390.
Olin Corp. Chemical Abstracts Molecular Composition Search (55051-85-9), (7392-62-3), (105443-51-4), (105443-50-3), (61227-12-1), (61234-46-6), (61234-45-51), (61234-68-2), (71655-03-3), (61227-15-4), (58115-06-3), (25577-00-8), and (21554-79-0).

Primary Examiner—Charles L. Bowers, Jr.
Assistant Examiner—John S. Chu
Attorney, Agent, or Firm—William A. Simons

[57] ABSTRACT

A methylol-substituted trihydroxybenzophenone of the formula (I):

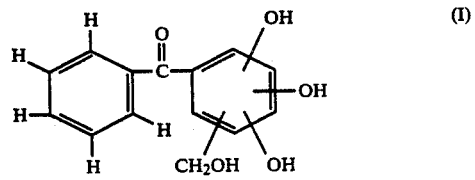

This methylol-substituted trihydroxybenzophenone may be reacted with selected phenolic monomers during or after the formation of a phenolic novolak resin thereby said resin having at least one unit of formula (II):

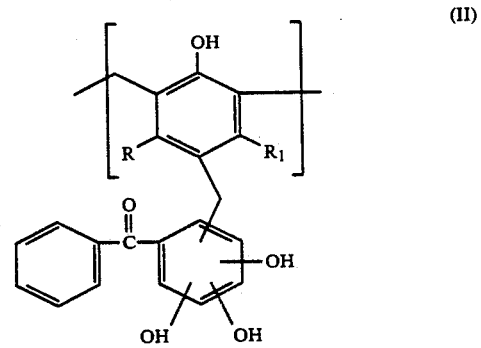

wherein R and $R_1$ are individually selected from hydrogen, a lower alkyl group having 1 to 4 carbon atoms or a lower alkoxy group having 1 to 4 carbon atoms.

7 Claims, No Drawings

SELECTED METHYLOL-SUBSTITUTED TRIHYDROXYBENZOPHENONES AND THEIR USE IN PHENOLIC RESIN COMPOSITIONS AND PROCESSES OF FORMING RESIST IMAGES

This application is a division of application Ser. No. 07/654,841, filed Feb. 13, 1991, now U.S. Pat. No. 5,177,172 issued on Jan. 5, 1993, which is a division of application Ser. No. 07/200,676 filed May 31, 1988 now U.S. Pat. No. 5,002,851 issued on May 26, 1991.

BACKGROUND OF THE INVENTION

1. Field of the Invention

The present invention relates to selected methylol-substituted trihydroxybenzophenones as novel compositions of matter. The present invention relates to selected phenolic resins containing at least one unit which is a condensation product of the selected methylol-substituted trihydroxbenzophenones and selected phenolic monomers. Furthermore, the present invention relates to light-sensitive compositions useful as positive-working photoresist compositions, particularly, those containing these phenolic resins and o-quinonediazide photosensitizers. Still further, the present invention also relates to substrates coated with these light-sensitive compositions as well as the process of coating, imaging and developing these light-sensitive mixtures on these substrates.

2. Description of Related Art

Photoresist compositions are used in microlithographic processes for making miniaturized electronic components such as in the fabrication of integrated circuits and printed wiring board circuitry. Generally, in these processes, a thin coating or film of a photoresist composition is first applied to a substrate material, such as silicon wafers used for making integrated circuits or aluminum or copper plates of printed wiring boards. The coated substrate is then baked to evaporate any solvent in the photoresist composition and to fix the coating onto the substrate. The baked coated surface of the substrate is next subjected to an image-wise exposure of radiation. This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions—negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to a developing solution. Thus, treatment of an exposed negative-working resist with a developer solution causes removal of the non-exposed areas of the resist coating and the creation of a negative image in the photoresist coating, and thereby uncovering a desired portion of the underlying substrate surface on which the photoresist composition was deposited. On the other hand, when positive-working photoresist compositions are exposed image-wise to radiation, those areas of the resist composition exposed to the radiation become more soluble to the developer solution (e.g. a rearrangement reaction occurs) while those areas not exposed remain relatively insoluble to the developer solution. Thus, treatment of an exposed positive-working resist with the developer solution causes removal of the exposed areas of the resist coating and the creation of a positive image in the photoresist coating. Again, a desired portion of the underlying substrate surface is uncovered.

After this development operation, the now partially unprotected substrate may be treated with a substrate-etchant solution or plasma gases and the like. This etchant solution or plasma gases etch the portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining resist layer after the development step and before the etching step to increase its adhesion to the underlying substrate and its resistance to etching solutions.

Positive-working photoresist compositions are currently favored over negative-working resists because the former generally have better resolution capabilities and pattern transfer characteristics.

Photoresist resolution is defined as the smallest feature which the resist composition can transfer from the photomask to the substrate with a high degree of image edge acuity after exposure and development. In many manufacturing applications today, resist resolution on the order of one micron or less are necessary.

In addition, it is generally desirable that the developed photoresist wall profiles be near vertical relative to the substrate. Such demarcations between developed and undeveloped areas of the resist coating translate into accurate pattern transfer of the mask image onto the substrate.

One drawback with positive-working photoresists known heretofore is their limited resistance to thermal image deformation. This limitation is becoming an increasing problem because modern processing techniques in semiconductor manufacture (e.g. plasma etching, ion bombardment) require photoresist images which have higher image deformation temperatures (e.g. 1500° C.–200° C.). Past efforts to increase thermal stability (e.g. increased molecular weight of the resin) generally caused significant decrease in other desirable properties (e.g. decreased photospeed, diminished adhesion, or reduced contrast, poorer developer dissolution rates), or combinations thereof].

Accordingly, there is a need for improved positive-working photoresist formulations which produce images that are resistant to thermal deformation at temperatures of about 150° to 200° C. while maintaining the other desired properties (e.g. developer dissolution rates) at suitable levels. The present invention is believed to be an answer to that need.

SUMMARY OF THE INVENTION

Accordingly, the present invention is directed to selected methylol-substituted trihydroxybenzophenones of the formula (I):

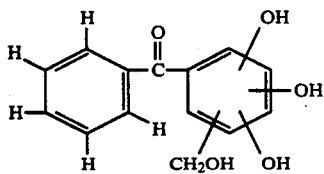

(I)

Moreover the present invention is directed to a phenolic novolak resin comprising at least one unit of formula (II):

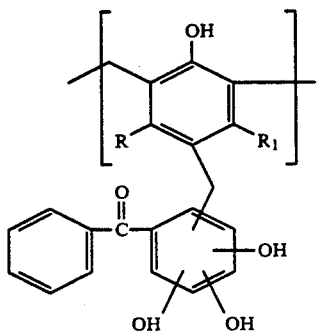

(II)

wherein R and R₁ are individually selected from hydrogen, a lower alkyl group having 1 to 4 carbon atoms and a lower alkoxy having 1 to 4 carbon atoms and said unit or units of formula (II) are made by condensing the methylol-substituted trihydroxybenzophenone of formula (I) with selected phenolic monomer units of formula (III):

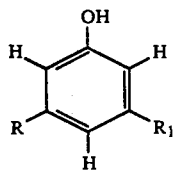

(III)

wherein R and R₁ are defined above.

Moreover, the present invention is directed to a light-sensitive composition useful as a positive photoresist comprising an admixture of o-quinonediazide compound and binder resin comprising at least one unit of the formula (II), above; the amount of said o-quinonediazide compound or compounds being about 5% to about 40% by weight and the amount of said binder resin being about 60% to 95% by weight, based on the total solid content of said light-sensitive composition.

Still further, the present invention also encompasses the process of coating substrates with these light-sensitive compositions and then imaging and developing these coated substrates.

Also further, the present invention encompasses said coated substrates (both before and after imaging) as novel articles of manufacture.

DETAILED DESCRIPTION

The selected methylol-substituted trihydroxybenzophenones of formula (I) are made by reacting the corresponding trihydroxybenzophenone with formaldehyde under alkaline pH conditions. This reaction is illustrated below in reaction equation (A) wherein the trihydroxybenzophenone is 2,3,4-trihydroxybenzophenone and the alkali employed is NaOH and 5-methylol-2,3,4-trihydroxybenzophenone is made:

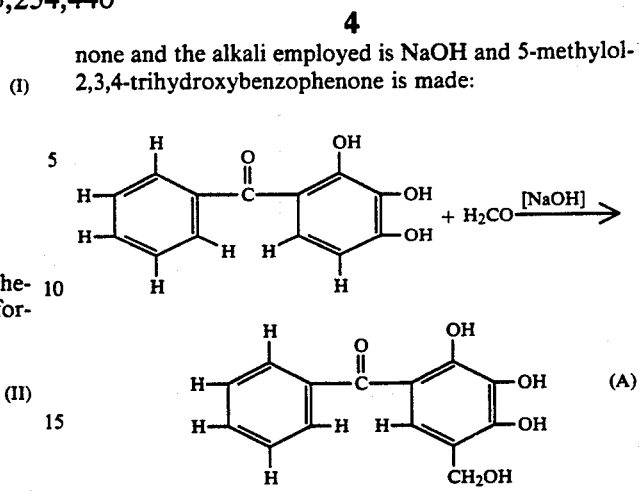

It should be noted that when 2,3,4-trihydroxybenzophenone is employed as the reactant, the reaction occurs almost completely at the 5-position of the trihydroxyphenyl ring. Other isomeric reactions are insignificant. The reason for the selectivity of this particular reaction is the relative electronic activation of the 5-position by the hydroxyl groups on the ring; however, the present invention is not to be limited to any particular reactants or process limitation for this particular type of reaction.

In making the class of compounds of the present invention, the precursors are preferably reacted at about a 1:1 mole ratio. The preferred reaction temperature is about 40°–500° C. for about 2.5 hours or less at atmospheric pressure. Excess reaction time may cause undesirable polymerization of the intended product. This reaction preferably occurs at an alkaline pH of greater than 7. The pH may be controlled by the addition of specific amounts of alkaline compounds (e.g. NAOH, KOH, Na₂CO₃ and the like). The intended product may be recovered from the reaction mixture by mixing the reaction mixture with acidified water and thus precipitating the product in solid form.

The phenolic resins containing one or more units of formula (II) above are preferably made by reacting the methylol-substituted trihydroxybenzophenone of formula (I), above, and the selected phenolic monomers having units of formula (III) with formaldehyde under usual novolak-making conditions. Generally, this reaction occurs in the presence of an acid catalyst. Suitable acid catalysts include those commonly employed in acid condensation-type reactions such as HCl, H₃PO₄, H₂SO₄, oxalic acid, maleic acid, maleic anhydride and organic sulfonic acids (e.g. p-toluene sulfonic acid). The most preferred acid catalyst is oxalic acid. Generally, it is also preferred to carry out the condensation reaction of compounds of formulae (I) with (III) either simultaneously or after the novolak polymerization in the presence of an aqueous medium or an organic solvent. Suitable organic solvents include ethanol, tetrahydrofuran, cellosolve acetate, 1-methoxy-2-propanol and 2-ethoxy ethanol. Preferred solvents are water-soluble solvents such as ethanol, 1-methoxy-2-propanol and 2-ethoxy ethanol.

The mole ratio of the methylol-substituted trihydroxybenzophenone to the total of the other phenolic compounds (preferably, a combination of meta- and para-cresols) is generally from about 0.1:99.9 to 20:80; more preferably, about 5:95 to about 10:90.

The methylolated trihydroxybenzophenone of formula (I) predominately reacts in the para-position on the phenolic molecules as illustrated in formula (III), above. For example, this trihydroxybenzophenone compound will predominately react with phenol or ortho- or meta-cresol, but less favorably with para-substituted phenolic molecules. The thus prepared novolaks containing the units of formula (II), above, have showed greater dissolution rates in aqueous alkaline developers than corresponding novolaks prepared without these units. Furthermore, light-sensitive compositions prepared with novolaks containing these units of formula (II) also showed good thermal stability due to their higher molecular weight and high resolution images. It is also believed that the presence of the units of formula (II) in the novolak resin significantly reduce the degree of branching of the novolak and provide unhindered hydroxyl (OH) groups for improved solubility properties and chemical reactivity.

In making the present class of resins, the precursors, namely, the trihydroxybenzophenones of formula (I) and the phenolic monomers (most preferably, a mixture of meta- and para-cresols) are preferably placed in a reaction vessel with formaldehyde. The reaction mixture usually also contains an acid catalyst and solvent as noted above. The mixture is then preferably heated to a temperature in the range from about 60° C. to about 120° C., more preferably from about 65° C. to about 95° C., for both the novolak-forming condensation polymerization reaction and the separate phenolic resin-trihydroxybenzophenone condensation reaction to occur. If an aqueous medium is used instead of an organic solvent, the reaction temperature is usually maintained at reflux, e.g. about 95° C. to 110° C. The reaction time will depend on the specific reactants used and the ratio of formaldehyde to phenolic monomers. The mole ratio of formaldehyde to total phenolic moieties is generally less than about 1:1. Reaction times from 3 to 20 hours are generally suitable. Alternatively, the trihydroxybenzophenones of formula (I) may be first reacted to the phenolic monomers of formula (III) without the presence of formaldehyde. In such cases, the condensation product of formula (II) is made and such condensation products may then be reacted with formaldehyde along with other phenolic monomers to make the novolak resins of the present invention.

The most preferred methylol-substituted trihydroxybenzophenone is 5-methylol-2,3,4-trihydroxybenzophenone as shown above in formula (A). The most preferred phenolic monomers is a mixture of meta-cresol and para-cresol having a mole ratio ranging from about 70:30 to about 30:70, respectively.

Branched and unbranched novolak resins made from this mixture of meta- and para-cresols will thus include the following types of repeated phenolic units: (1) units of formula (II) above; (2) meta-cresol units of the formula (IV), (IVA) and (IVB):

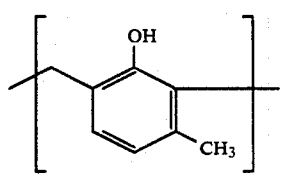
(IV)

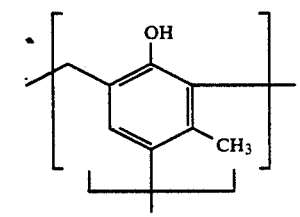
(IVA)

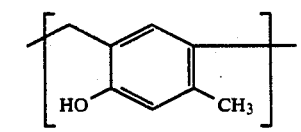
(IVB)

and para-cresol units of formula (V):

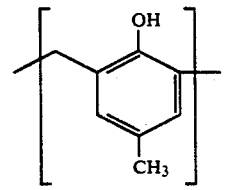
(V)

Regardless of the presence or absence of the further units of formulae (IV) and (V), the resins of the present invention preferably have a molecular weight of from about 500 to about 25,000, more preferably from about 750 to about 20,000. The preferred resins have from about 0.1% to about 30%, more preferably about 5% to 10% by moles of the units of formula (II).

The above-discussed resins of the present invention may be mixed with photoactive compounds to make light-sensitive mixtures which are useful as positive acting photoresists. The preferred class of photoactive compounds (sometimes called light sensitizers) is o-quinonediazide compounds particularly esters derived from polyhydric phenols, alkylpolyhydroxyphenones, aryl-polyhydroxyphenones, and the like which can contain up to six or more sites for esterification. The most preferred o-quinonediazide esters are derived from 2-diazo-1,2-dihydro-1-oxonaphthlene-4-sulfonic acid and 2-diazo-1,2-dihydro-1-oxo-naphthalene-5-sulfonic acid.

Specific examples include resorcinol 1,2-naphthoquinonediazide-4-sulfonic acid esters; pyrogallol 1,2-naphthoquinonediazide-5-sulfonic acid esters, 1,2-quinonediazidesulfonic acid esters of (poly)hydroxyphenyl alkyl ketones or (poly)hydroxyphenyl aryl ketones such as 2,4-dihydroxyphenyl propyl ketone 1,2-benzoquinonediazide-4-sulfonic acid esters, 2,4,dihydroxyphenyl hexyl ketone 1,2-naphthoquinonediazide-4-sulfonic acid esters, 2,4-dihydroxybenzophenone 1,2-naphthoquinonediazide-5-sulfonic acid esters, 2,3,4-trihydroxyphenyl hexyl ketone, 1,2-naphthoquinonediazide-4-sulfonic acid esters, 2,3,4-trihydroxybenzophenone 1,2-naphthoquinonediazide-4-sulfonic acid esters, 2,3,4-trihydroxybenzophenone 1,2-naphthoquinonediazide-5-sulfonic acid esters, 2,4,6-trihydroxybenzophenone 1,2-naphthoquinonediazide-4-sulfonic acid esters, 2,4,6-trihydroxybenzophenone 1,2-naphthoquinonediazide-5-sulfonic acid esters, 2,2',4,4'-tetrahydroxybenzophenone 1,2-naphthoquinonediazide-5-sulfonic acid esters, 2.3.4,4'-tetrahydroxy-benzophenone 1,2-naphthoquinonediazide-5-sulfonic acid esters, 2,3,4,4'-tetrahydroxybenzophenone 1,2-naphthoquinonediazide-4-sulfonic acid esters, 2,2',3,4',6,1'-pentahydroxybenzophenone 1,2-naphthoquinonediazide-5-sulfonic acid esters and 2,3,3',4,4',5'-hexahydroxybenzophenone 1,2-naphthoquinonediazide-5-sulfonic acid esters; 1,2-quinonediazidesulfonic acid esters of bis[(poly)hydroxyphenyl]alkanes such as bis(p-hydroxyphenyl)methane 1,2-naphthoquinonediazide-4-sulfonic acid esters, bis(2,4-dihydroxyphenyl)methane 1,2-naphthoquinone-diazide-5-sulfonic acid esters, bis(2,3,4-trihydroxy-phenyl)methane 1,2-naphthoquinonediazide-5-sulfonic acid esters, 2,2-bis(p-hydroxyphenyl)propane 1,2-naphthoquinonediazide-4-sulfonic acid esters, 2,2-bis(2,4-dihydroxyphenyl)propane 1,2-naphthoquinonediazide-5-sulfonic acid esters and 2,2-bis(2,3,4-trihydroxyphenyl)propane 1,2-naphthoquinonediazide-5-sulfonic acid esters. Besides the 1,2-quinonediazide compounds exemplified above, there can also be used the 1,2-quinonediazide compounds described in J. Kosar, "Light-Sensitive Systems", 339–352 (1965), John Wiley Sons (New York) or in S. DeForest, "Photoresist", 50, (1975), MacGraw-Hill, Inc. (New York). In addition, these materials may be used in combinations of two or more. Further, mixtures of substances formed when less than all esterification sites present on a particular polyhydric phenol, alkyl-polyhydroxyphenone, arylpolyhydroxyphenone and the like have combined with o-quinonediazides may be effectively utilized in positive acting photoresists.

Of all the 1,2-quinonediazide compounds mentioned above, 1,2-naphthoquinonediazide-5-sulfonic acid di-, tri-, tetra-, penta- and hexa-esters of polyhydroxy compounds having at least 2 hydroxyl groups, i.e. about 2 to 6 hydroxyl groups, are most preferred.

Among these most preferred 1,2-naphthoquinone-5-diazide compounds are 2,3,4-trihydroxybenzophenone 1,2-naphthoquinonediazide-5-sulfonic acid esters, 2,3,4,4'-tetrahydroxybenzophenone 1,2-naphthoquinonediazide-5-sulfonic acid esters, and 2,2',4,4'-tetrahydroxybenzophenone 1,2-naphthoquinonediazide-5-sulfonic acid esters. These 1,2-quinonediazide compounds may be used alone or in combination of two or more.

The proportion of the light sensitizer compound in the light-sensitive mixture may preferably range from about 5 to about 40%, more preferably from about 10 to about 25% by weight of the non-volatile (e.g. non-solvent) content of the light-sensitive mixture. The proportion of total binder resin of this present invention in the light-sensitive mixture may preferably range from about 60 to about 95%, more preferably, from about 75 to 90% of the non-volatile (e.g. excluding solvents) content of the light-sensitive mixture.

These light-sensitive mixtures may also contain conventional photoresist composition ingredients such as other resins, solvents, actinic and contrast dyes, anti-striation agents, plasticizers, speed enhancers, and the like. These additional ingredients may be added to the binder resin and sensitizer solution before the solution is coated onto the substrate.

Other binder resins may also be added beside the resins of the present invention mentioned above. Examples include phenolic-formaldehyde resins, cresol-formaldehyde resins, phenol-cresol-formaldehyde resins and polvinylphenol resins commonly used in the photoresist art. If other binder resins are present, they will replace a portion of the binder resins of the present invention. Thus, the total amount of the binder resin in the light-sensitive composition will be from about 60% to aout 95% by weight of the total non-volatile solids content of the light-sensitive composition.

The resins and sensitizers may be dissolved in a solvent or solvents to facilitate their application to the substrate. Examples of suitable solvents include methoxyacetoxy propane, ethyl cellosolve acetate, n-butyl acetate, xylene, ethyl lactate, propylene glycol alkyl ether acetates, or mixtures thereof and the like. The preferred amount of solvent may be from about 50% to about 500%, or higher, by weight, more preferably, from about 100% to about 400% by weight, based on combined resin and sensitizer weight.

Actinic dyes help provide increased resolution on highly reflective surfaces by inhibiting back scattering of light off the substrate. This back scattering causes the undesirable effect of optical notching, especially on a substrate topography. Examples of actinic dyes include those that absorb light energy at approximately 400–460 nm [e.g. Fat Brown B (C.I. No. 12010); Fat Brown RR (C.I. No. 11285); 2-hydroxy-1,4-naphthoquinone (C.I. No. 75480) and Quinoline Yellow A (C.I. No. 47000)] and those that absorb light energy at approximately 300–340 nm [e.g. 2,5-diphenyloxazole (PPO-Chem. Abs. Reg. No. 92-71-7) and 2-(4-biphenyl)-6-phenylbenzoxazole (PBBO-Chem. Abs. Reg. No. 17064-47-0)]. The amount of actinic dyes may be up to ten percent weight levels, based on the combined weight of resin and sensitizer.

Contrast dyes enhance the visibility of the developed images and facilitate pattern alignment during manufacturing. Examples of contrast dye additives that may be used together with the light-sensitive mixtures of the present invention include Solvent Red 24 (C.I. No. 26105), Basic Fuchsin (C.I. 42514), oil Blue N (C.I. No. 61555) and Calco Red A (C.I. No. 26125) up to ten percent weight levels, based on the combined weight of resin and sensitizer.

Anti-striation agents level out the photoresist coating or film to a uniform thickness. Anti-striation agents may be used up to five percent weight levels, based on the combined weight of resin and sensitizer. One suitable class of anti-striation agents is non-ionic silicon-modified polymers. Non-ionic surfactants may also be used for this purpose, including, for example, nonylphenoxy poly(ethyleneoxy) ethanol; octylphenoxy (ethyleneoxy) ethanol; and dinonyl phenoxy poly(ethyleneoxy) ethanol.

Plasticizers improve the coating and adhesion properties of the photoresist composition and better allow for the application of a thin coating or film of photoresist which is smooth and of uniform thickness onto the substrate. Plasticizers which may be used include, for example, phosphoric acid tri-(B-chloroethyl)-ester; stearic acid; dicamphor; polypropylene; acetal resins; pbenoxy resins; and alkyl resins up to ten percent weight levels, based on the combined weight of resin and sensitizer.

Speed enhancers tend to increase the solubility of the photoresist coating in both the exposed and unexposed areas, and thus, they are used in applications where speed of development is the overriding consideration even though some degree of contrast may be sacrificed, i.e. in positive resists while the exposed areas of the photoresist coating will be dissolved more quickly by the developer, the speed enhancers will also cause a larger loss of photoresist coating from the unexposed areas. Speed enhancers that may be used include, for example, picric acid, nicotinic acid or nitrocinnamic acid at weight levels of up to 20 percent, based on the combined weight of resin and sensitizer.

The prepared light-sensitive resist mixture, can be applied to a substrate by any conventional method used in the photoresist art, including dipping, spraying, whirling and spin coating. When spin coating, for example, the resist mixture can be adjusted as to the percentage of solids content in order to provide a coating of the desired thickness given the type of spinning equipment and spin speed utilized and the amount of time allowed for the spinning process. Suitable substrates include silicon, aluminum or polymeric resins, silicon dioxide, doped silicon dioxide, silicon resins, gallium arsenide, silicon nitride, tantalum, copper, polysilicon, ceramics and aluminum/copper mixtures.

The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters and polyolefins.

After the resist solution is coated onto the substrate, the coated substrate is baked at approximately 70° C. to 125° C. until substantially all the solvent has evaporated and only a uniform light-sensitive coating remains on the substrate.

The coated substrate can then be exposed to radiation, especially ultraviolet radiation, in any desired exposure pattern, produced by use of suitable masks, negatives, stencils, templates, and the like. Conventional imaging process or apparatus currently used in processing photoresist-coated substrates may be employed with the present invention. In some instances, a post-exposure bake at a temperature about 10° C. higher than the soft bake temperature is used to enhance image quality and resolution.

The exposed resist-coated substrates are next developed in an aqueous alkaline developing solution. This solution is preferably agitated, for example, by nitrogen gas agitation. Examples of aqueous alkaline developers include aqueous solutions of tetramethylammonium hydroxide, sodium hydroxide, potassium hydroxide, ethanolamine, choline, sodium phosphates, sodium carbonate, sodium metasilicate, and the like. The preferred developers for this invention are aqueous solutions of either alkali metal hydroxides, phosphates or silicates, or mixtures thereof, or tetramethylammonium hydroxide.

Alternative development techniques such as spray development or puddle development, or combinations thereof, may also be used.

The substrates are allowed to remain in the developer until all of the resist coating has dissolved from the exposed areas. Normally, development times from about 10 seconds to about 3 minutes are employed.

After selective dissolution of the coated wafers in the developing solution, they are preferably subjected to a deionized water rinse to fully remove the developer or any remaining undesired portions of the coating and to stop further development. This rinsing operation (which is part of the development process) may be followed by blow drying with filtered air to remove excess water. A post-development heat treatment or bake may then be employed to increase the coating's adhesion and chemical resistance to etching solutions and other substances. The post-development heat treatment can comprise the baking of the coating and substrate below the coating's thermal deformation temperature.

In industrial applications, particularly in the manufacture of microcircuitry units on silicon/silicon dioxide-type substrates, the developed substrates may then be treated with a buffered, hydrofluoric acid etching solution or plasma gas etch. The resist compositions of the present invention are believed to be resistant to a wide variety of acid etching solutions or plasma gases and provide effective protection for the resist-coated areas of the substrate.

Later, the remaining areas of the photoresist coating may be removed from the etched substrate surface by conventional photoresist stripping operations.

The present invention is further described in detail by means of the following Examples. All parts and percentages are by weight unless explicitly stated otherwise.

EXAMPLE 1

Synthesis of 5-Methylol-2,3,4-trihydroxybenzophenone Employing 2.5 Hours Reaction Time at 40°–47° C.

2,3,4-Trihydroxybenzophenone (300 gm (1.3 moles)) was added to a 3 liter, three neck flask equipped with mechanical agitation, a thermometer, a condenser and an addition funnel. An aqueous solution of sodium hydroxide [208 gm 98% by weight NAOH dissolved in 1 liter of distilled water (5.1 moles NaOH)] was added slowly to the flask. A dark aqueous solution of the trihydroxybenzophenone was formed rapidly. A slight exotherm was observed causing the solution temperature to rise to ~48° C.

An aqueous 36.5% by weight formaldehyde solution [123.3 gm (1.5 moles)] was then added dropwise through the addition funnel at a controlled rate so not to cause the reaction temperature to exceed 50° C. Half the formaldehyde solution was added rapidly in five minutes and the second half over a total of 80 minutes. After addition, the reaction was allowed to proceed for an additional 80 minutes before it was acidified with a dilute 37% aqueous hydrochloric acid solution by weight [513 gm (5.2 moles HCl)]. The change in the pH of the solution to a neutral or slightly acidic was associated with a change in its color to a yellowish orange.

The reaction solution was transferred to a larger container filled with 3 liters of distilled water under vigorous agitation. The reaction solution was dripped slowly into the agitated water over 30 minutes duration. A light solid precipitate was formed. The solid product was filtered out and dried in a vacuum oven at 50° C. for about 20 hours to remove substantially all water in the product.

The dried product weighed 306.5 gm which represented a 90.7% yield based on a theoretical yield of 338 gm.

The structure of the above titled compound was confirmed by infrared spectral analysis and by proton NMR. The observed NMR ratio of the aliphatic hydrogens to the aromatic hydrogens was 0.296. Compared with the theoretical ratio value of 0.33 for this compound the product purity is 87.99 by moles. High pressure liquid chromatography detected the presence of approximately 7% by weight of trihydroxybenzophenone starting material indicating that this was the major impurity.

EXAMPLE 2

Synthesis of 5-Methylol-2,3,4-trihydroxybenzophenone Employing 2 Hours Reaction Time at 40°-45° C.

2,3,4-Trihydroxybenzophenone [300 gm (1.3 moles)] was added to a 3 liter, three neck flask equipped with mechanical agitation, thermometer, a condenser and an addition funnel. An aqueous solution of sodium hydroxide [208 gm 98% by weight NAOH dissolved in 1 liter of distilled water (5.1 moles NAOH)] was added slowly to the flask. A dark aqueous solution of the trihydroxybenzophenone was formed rapidly.

A slight exotherm was observed causing the solution temperature to rise to ~45° C.

An aqueous 36.5% by weight formaldehyde solution [123.3 gm (1.5 moles)] was then added dropwise through the addition funnel at a controlled rate so not to cause the reaction temperature to exceed 50° C. Half the formaldehyde solution was added over a period of 70 minutes and the second half over a period of 110 minutes. The reaction solution was poured into a larger container filled with 3 liters of distilled water under vigorous agitation. The reaction mixture was acidified with a dilute 37% aqueous hydrochloric acid solution by weight (513 gm (5.2 moles HCl)]. The change in the pH of the solution to a neutral or slightly acidic was associated with the precipitation of the product in the form of a yellowish orange solid particle. The product was filtered out of solution and reslurried in fresh distilled water three times to wash off trace acid as detected by the neutral pH of the last water wash.

The product was dried in a vacuum oven at 50° C. for 24 hours to remove substantially all water.

The dried product weighed 320 gm which represented a 94.7% yield based on a theoretical yield of 338 gm.

The structure of the above titled compound was confirmed by infrared spectral analysis and by proton NMR. The observed NMR ratio of the aliphatic hydrogens to the aromatic hydrogens was 0.265. Compared with the theoretical ratio value of 0.33 for this compound the product purity is 80.3 moles. High pressure liquid chromatography detected the presence of 8.8% by weight of the trihydroxybenzophenone starting material indicating that this was the major impurity.

COMPARISON 1

Synthesis of 5-Methylol-2,3,4-Trihydroxybenzophenone Employing 26 Hours Reaction Time And An Excess Of Formaldehyde 2,3,4-Trihydroxybenzophenone [200 gm (1.3 moles)] was added to a 3 liter, three neck flask equipped with mechanical agitation, thermometer, a condenser and an addition funnel. An aqueous solution of sodium hydroxide [106.5 gm 98% by weight NAOH dissolved in 690 gm of distilled water (2.6 moles NaOH)] was added slowly to the flask. A dark aqueous solution of the trihydroxybenzophenone was formed rapidly. A slight exotherm was observed causing the solution temperature to raise to ~42° C.

An aqueous 36.5% by weight formaldehyde solution [147 gm (1.79 moles)] was added dropwise through the addition funnel in two parts. The first portion of the formaldehyde solution [86 gm (1.05 moles)] was added over a period of 85 minutes. The reaction was then allowed to continue for 22 hours at 40°-42° C. before adding the section portion of the remaining formaldehyde solution [61 gm (0.74 moles)] over a period of 70 minutes. Approximately 70 minutes later the reaction solution was poured into a larger container filled with 3.3 liters of distilled water under vigorous agitation.

The reaction mixture was acidified with glacial acetic acid solution (156 gm) added over a 2 hour period at 28° C. The change in the solution acidity to a pH of 4 associated with the precipitation of the product in the form of a yellowish orange solid particle. The product was filtered out of solution and dried in a vacuum oven at 50° C. for 24 hours to remove substantially all water.

The dried product weighed 199.4 gm which represented a 88.25% yield based on a theoretical yield of 226 gm.

The structure of the above titled compound was not confirmed by proton NMR analysis. The theoretical NMR ratio of the aliphatic hydrogens to the aromatic hydrogens for this compound is 0.33. The observed NMR ratio of the product of this reaction was 0.08 suggesting a low purity mixture.

It is postulated that further condensation of the desired product into higher oligmers may have formed under this extended reaction time and at this higher formaldehyde level.

EXAMPLE 3

Mixed Cresol Novolak Synthesis Containing 10 Mole Percent Of 5-Methylol-2,3,4-Trihydroxybenzophenone A mixture of m-cresol [248.28 gm (2.3 moles)], p-cresol [165.5 gm (1.53 moles)), a 37.8% aqueous solution of formaldehyde [228 gm (2.86 moles)] and oxalic acid dehydrate [1 gm (0.0081 moles)) was charged into a resin flask. The 1000 ml capacity resin flask used for this reaction was equipped with a mechanical strirrer, a water cooled condenser, a thermometer, an addition funnel, a nitrogen inlet valve and an adequate heating-/cooling capacity. The reaction solution was heated up to 60° C. before the addition of the 5-methylol-2,3,4-trihydroxybenzophenone product of Example 1 was started [100 gm dissolved in 285 ml methanol/methoxyacetoxypropane (about 0.38 moles). This solution was added to the reaction mixture through the addition funnel over a period of 1.5 hours at a temperature range of 100°-83° C. The reaction was allowed to continue at reflux temperature for another 1.5 hours before starting atmospheric distillation. The condenser was adjusted from the reflux vertical position to the horizontal distillation tilted position and a receiving flask was installed at its end. The reaction temperature was raised up to 190° C. as the water and formaldehyde were removed. At this point 335.5 gm of aqueous distillate was collected in the receiving flask. The duration of the atmospheric distillation was about 2 hours. Vacuum was applied gradually to remove unreacted cresols. The maximum temperature allowed during the vacuum distillation was 235° C. at 2 mm/Hg of pressure. Most of the residual unreacted cresols were removed rapidly before applying full vacuum. It was necessary to hold full vacuum for one hour and 40 minutes to insure the removal of essentially all unreacted cresol monomers. Nitrogen gas was used to equalize the pressure inside the flask and to avoid the oxidation of the molten novolak. The novolak was poured into an aluminum tray under an atmosphere of nitrogen and was cooled to room temperature.

420 gm of solid novolak was collected containing less than 0.5% cresol monomers by weight. The softening point of the novolak was 142.5°-143° C. determined by the ring and ball method, ASTM No. 06.03.

EXAMPLE 4

Mixed Cresol Novolak Synthesis Containing 5 Mole Percent Of 5-Methylol-2,3,4-Trihydroxybenzophenone A mixture of m-cresol [135.6 gm (1.25 moles)], p-cresol [90.6 gm (0.84 moles)), a 37.7% aqueous solution of formaldehyde [46.6 gm (0.586 moles)), oxalic acid dehydrate [1 gm (0.0081 moles)) and the 5-methylol-2,3,4-trihydroxybenzophenone product of Example 1 [30 gm (about 0.13 moles)] were charged into a resin flask. The 1000 ml capacity resin flask used for this reaction was equipped with a mechanical stirrer, a water cooled condenser, a thermometer, a nitrogen inlet valve and an adequate heating/cooling capacity. The reaction solution was heated up to reflux (99°-100° C.) and was allowed to react for three hours before starting atmospheric distillation. The condenser was adjusted from the reflux vertical position to the horizontal distillation tilted position and a receiving flask was installed at its end. The reaction temperature was raised up to 175° C. as the water and formaldehyde were removed. At this point 93 gm of aqueous distillate was collected in the receiving flask. The duration of the atmospheric distillation was about 50 minutes.

Vacuum was applied gradually to remove unreacted cresols. The maximum temperature allowed during the vacuum distillation was 215° C. at 2 mm/Hg of pressure. Most of the residual unreacted cresols were removed rapidly before applying full vacuum, however, it was necessary to hold full vacuum for 25 minutes to insure the removal of essentially all unreacted cresol monomers. Nitrogen gas was used to equalize the pressure inside the flask and to avoid the oxidation of the molten novolak. The novolak was poured into an aluminum tray under an atmosphere of nitrogen and was cooled to room temperature. A total of 65 gm of unreacted cresols was collected in the receiving flask at the end of the vacuum distillation. 216 gm of solid novolak was collected containing less than 0.5% cresol monomers by weight. The softening point of the novolak was 156° C. determined by the ring and ball method, ASTM No. 06.03.

EXAMPLE 5

Mixed Cresol Novolak Synthesis Containing 7 Mole Percent Of 5-Methylol-2,3,4-Trihydroxybenzophenone A mixture of m-cresol [126 gm (1.17 moles)], p-cresol [84 gm (0.78 moles)), a 36.5% aqueous solution of formaldehyde [121.5 gm (1.483 moles)], oxalic acid dihydrate [1 gm (0.0081 moles)) and the 5-methylol-2,3,4-trihydroxybenzophenone product of Example 1 [40 gm (about 0.13 moles)]were charged into a resin flask. The 1000 ml capacity resin flask used for this reaction was equipped with a mechanical stirrer, a water cooled condenser, a thermometer, a nitrogen inlet valve and an adequate heating/cooling capacity. The reaction solution was heated up to reflux (98° C.) and was allowed to react for three hours before starting atmospheric distillation. The condenser was adjusted from the reflux vertical position to the horizontal distillation tilted position and a receiving flask was installed at its end. The reaction temperature was raised up to 200° C. as the water and formaldehyde were removed. The duration of the atmospheric distillation was 1.5 hours. Vacuum was applied gradually to remove unreacted cresols. The maximum temperature allowed during the vacuum distillation was 227° C. at 2 mm/Hg of pressure. Most of the residual unreacted cresols were removed rapidly before applying full vacuum. It was necessary to hold full vacuum for 45 minutes to insure the removal of essentially all unreacted cresol monomers. Nitrogen gas was used to equalize the pressure inside the flask and to avoid the oxidation of the molten novolak. The novolak was poured into an aluminum tray under an atmosphere of nitrogen and was cooled to room temperature. 218 gm of solid novolak was collected containing less than 0.5% cresol monomers by weight. The softening point of the novolak was 160° C. determined by the ring and ball method, ASTM No. 06.03.

COMPARISON 2

Mixed Cresol Novolak Synthesis With No 5-Methylol-21314-Trihydroxybenzophenone Added A mixture of m-cresol [607.2 gm (5.62 moles)], p-cresol [404.8 gm (3.75 moles)], a 37.75% aqueous solution of formaldehyde 1557 gm (7.03 moles)] and oxalic acid dehydrate [2 gm (0.0162 moles)] was charged into a resin flask. The 2000 ml capacity resin flask used for this reaction was equipped with a mechanical stirrer, a water cooled condenser, a thermometer, an addition funnel, a nitrogen inlet valve and an adequate heating/cooling capacity. The reaction solution was heated up to (100° C.) and was allowed to react at this reflux temperature for four hours before starting the atmospheric distillation. The condenser was adjusted from the reflux vertical position to the horizontal distillation tilted position and a receiving flask was installed at its end. The reaction temperature was raised up to 180° C. as the water and unreacted formaldehyde were removed. At this point 448.5 gm of aqueous distillate was collected in the receiving flask. The duration of the atmospheric distillation was about 2.5 hours. Vacuum was applied gradually to remove unreacted cresols. The maximum temperature allowed during the vacuum distillation was 235° C. at 2 mm/Hg of pressure. Most of the residual unreacted cresols were removed rapidly before applying full vacuum. It was necessary to hold full vacuum for 1.5 hours to insure the removal of essentially all unreacted cresol monomers. Nitrogen gas was used to equalize the pressure inside the flask and to avoid the oxidation of the molten novolak. The novolak was poured into an aluminum tray under an atmosphere of nitrogen and was cooled to room temperature.

838 gm of solid novolak was collected containing less than 0.5% cresol monomers by weight. The softening point of the novolak was 157.5°-157° C. determined by the ring and ball method, ASTM No. 06.03.

COMPARISON 3

Mixed Cresol Novolak Synthesis With No 5-Methylol-2,3,4-Trihydroxybenzophenone Added This reaction was carried out in a 500 gallon reactor using a similar cresol mixture as in the above examples (60% m-cresol:40% p-cresol). The formaldehyde molar ratio to cresols was 0.62. The total reaction time employed in this process was 18 hours. In addition, the total duration of the atmospheric distillation was approximately six hours and the vacuum distillation about four hours. The novolak was dissolved in ethyl cellosolve acetate to form a 31.88% solution.

This novolak was isolated in the dry solid form by distilling off the solvent from the solution (1887 gm solution) under vacuum at temperatures not exceeding 1600° C. in a similar manner to that described above. 710 gm of solid novolak was collected containing less than 0.5% cresol monomers by weight. The softening point of the novolak was 135°-138° C. determined by the ring and ball method, ASTM No. 06.03.

Table I below provides dissolution times, softening points and relative average molecular weight data of the novolaks prepared in Examples 3, 4, 5 and Comparisons 2 and 3. The data in Table I shows that 5-methylol-2,3,4-trihydroxybenzophenone-containing novolaks exhibit greater solubilities in aqueous alkaline solutions than the comparison mixed cresol novolaks having similar average molecular weights and softening points. In particular, Example 3 has a faster dissolution time than Comparison 3 and Examples 4 and 5 have a faster dissolution times than Comparison 2. The dissolution times were measured for dry one micron thick novolak coatings required to completely dissolve in an aqueous alkaline solution (HPRD-419 developer sold by Olin Hunt Specialty Products, Inc. of West Paterson, N.J.). Such coatings were prepared from novolak solutions in ethyl cellosolve acetate at approximately 25% solids content by means of spin coating. Silicon or silicon dioxide wafers were used as the coating substrates. The spin speeds employed using a Headway spinner were adjusted between 3000 to 6000 RPM to provide equal one micron coatings for all the novolak solutions according to variations in their solution viscosity as a function of their average molecular weights. The coatings were dried in a Blue M hot air circulating oven at 100°-105° C. for thirty minutes. The average molecular weights (MW) and average molecular number (MN) of these novolaks were measured by gel permination chromatography (GPC) under the following conditions:
Column Set: 500, 100, 10,000, 100 and 40 Angstroms
Solvent: Tetrahydrofuran
Detector: Refractive Index
Flow Rate: 1.5 ml/min.
Injection Volume: 300 ml
Calibration: Polystyrene standards

TABLE I

| Novolak Example or Comparison | Dissolution Time, Sec. | Softening Point | Molecular Weight | |
|---|---|---|---|---|
| | | | MW | MN |
| Example 3 | 5 | 143 | 3163 | 342 |
| Example 4 | 68 | 156 | 19949 | 738 |
| Example 5 | 20 | 160 | 16252 | 922 |
| Comparison 2 | 260 | 157 | 16630 | 478 |
| Comparison 3 | 10 | 138 | not determined | |

EXAMPLE 6

Preparation of Resist Solution

Novolak prepared according to Example 3 (56 gm) was dissolved in an appropriate solvent (144 gm methoxyacetoxypropane) in a 400 ml cylindrical bottle rolled on a high-speed roller for approximately 20 hours.

A portion of this solution (158.6 gm) was transferred into a 400 ml size cylindrical amber-colored glass bottle. To this solution 11.375 gm of the photoactive compound and an additional solvent (27.9 gm methoxyacetoxypropane) were added. The bottle was rolled on a high-speed roller for 12 hours at room temperature to dissolve all solids.

The photoactive sensitizer was prepared by reacting 2,3,4-trihydroxybenzophenone with naphthoquinone (1,2)-diazide-5-sulphonyl chloride in a 1:2 molar ratio. The sensitizer resulting from this reaction is a mixture of the sulphono mono-, di- and triesters with trihydroxybenzophenone as well as some unesterified trihydroxybenzophenone.

The resulting resist solution was subsequently filtered through a 0.2 um pore-size filter using a millipore microfiltration system (100 ml barrel and a 47 mm disk were used). The filtration was conducted in a nitrogen environment under a pressure of 30 pounds per square inch. Approximately 180 ml resist solution was obtained.

EXAMPLE 7

Preparation of Resist Solution

Novolak prepared according to Example 4 (56 gm) was dissolved in an appropriate solvent (144 gm methoxyacetoxypropane) in a 400 ml cylindrical bottle rolled on a high-speed roller for approximately 20 hours.

A portion of this solution (150 gm) was transferred into a 400 ml size cylindrical amber-colored glass bottle. To this solution 10.65 gm of the photoactive compound and an additional solvent (33.7 gm methoxyacetoxypropane) were added. The bottle was rolled on a high-speed roller for 12 hours at room temperature to dissolve all solids.

The photoactive sensitizer was prepared by reacting 2,3,4-trihydroxybenzophenone with naphthoquinone (1,2)-diazide-5-sulphonyl chloride in a 1:2 molar ratio. The sensitizer resulting from this reaction is a mixture of the sulphono mono-, di- and triesters with trihydroxybenzophenone as well as some unesterified trihydroxybenzophenone.

The resulting resist solution was subsequently filtered through a 0.2 um pore-size filter using a millipore microfiltration system (100 ml barrel and a 47 mm disk were used). The filtration was conducted in a nitrogen environment under a pressure of 30 pounds per square inch. Approximately 175 ml resist solution was obtained.

EXAMPLE 8

Preparation of Resist Solution

Novolak prepared according to Example 5 (30 gm) was dissolved in an appropriate solvent (70 gm ethyl lactate) in a 200 ml cylindrical bottle rolled on a high-speed roller for approximately 20 hours.

A portion of this solution (85 gm) was transferred into a 200 ml size cylindrical amber-colored glass bottle. To this solution 6.375 gm of the photoactive compound and an additional solvent (26.68 gm ethyl lactate) were added. The bottle was rolled on a high-speed roller for 12 hours at room temperature to dissolve all solids.

The photoactive sensitizer was prepared by reacting 2,3,4-trihydroxybenzopbenone with naphthoquinone (1,2)-diazide-5-sulphonyl chloride in a 1:2 molar ratio. The sensitizer resulting from this reaction is a mixture of the sulphono mono-, di- and triesters with trihydroxybenzophenone as well as some unesterified trihydroxybenzophenone.

The resulting resist solution was subsequently filtered through a 0.2 um pore-size filter using a millipore microfiltration system (100 ml barrel and a 47 mm disk were used). The filtration was conducted in a nitrogen environment under a pressure of 30 pounds per square inch. Approximately 100 ml resist solution was obtained.

COMPARISON 4

Preparation of Resist Solution

Novolak prepared according to Comparison 2 (98 gm) was dissolved in an appropriate solvent (252 gm methoxyacetoxypropane) in a 400 ml cylindrical bottle rolled on a high-speed roller for approximately 20 hours.

A portion of this solution (300 gm) was transferred into a 400 ml size cylindrical amber-colored glass bottle. To this solution 21.52 gm of the photoactive compound and an additional solvent (67.37 gm methoxyacetoxypropane) were added. The bottle was rolled on a high-speed roller for 12 hours at room temperature to dissolve all solids.

The photoactive sensitizer was prepared by reacting 2,3,4-trihydroxybenzophenone with naphthoquinone (1,2)-diazide-5-sulphonyl chloride in a 1:2 molar ratio. The sensitizer resulting from this reaction is a mixture of the sulphono mono-, di- and triesters with trihydroxybenzophenone as well as some unesterified trihydroxybenzophenone.

The resulting resist solution was subsequently filtered through a 0.2 um pore-size filter using a millipore microfiltration system (100 ml barrel and a 47 mm disk were used). The filtration was conducted in a nitrogen environment under a pressure of 30 pounds per square inch. Approximately 380 ml resist solution was obtained.

COMPARISON 5

Preparation of Resist Solution

Novolak prepared according to Comparison 3 (98 gm) was dissolved in an appropriate solvent (252 gm methoxyacetoxypropane) in a 400 ml cylindrical bottle rolled on a high-speed roller for approximately 20 hours.

A portion of this solution (300 gm) was transferred into a 400 ml size cylindrical amber-colored glass bottle. To this solution 21.52 gm of the photoactive compound and an additional solvent (46.9 gm methoxyacetoxypropane) were added. The bottle was rolled on a high-speed roller for 12 hours at room temperature to dissolve all solids.

The photoactive sensitizer was prepared by reacting 2,3,4-trihydroxybenzophenone with naphthoquinone (1,2)-diazide-5-sulphonyl chloride in a 1:2 molar ratio. The sensitizer resulting from this reaction is a mixture of the sulphono mono-, di- and triesters with trihydroxybenzophenone as well as some unesterified trihydroxybenzophenone.

The resulting resist solution was subsequently filtered through a 0.2 um pore-size filter using a millipore microfiltration system (100 ml barrel and a 47 mm disk were used). The filtration was conducted in a nitrogen environment under a pressure of 30 pounds per square inch. Approximately 350 ml resist solution was obtained.

PHOTORESIST PROCESSING

Coating of Photoresist Composition onto a Substrate

Photoresist solutions prepared in Examples 6, 7, 8 and Comparison 4 and 5 were spin-coated with a spinner manufactured by Headway Research Inc. (Garland, Texas) onto a thermally grown silicon/silicon dioxide-coated wafers of 10 cm (four inches) in diameter and 5000 angstroms in oxide thickness. Uniform coatings, after drying, of approximately 1.2 micron in thickness were obtained at spinning velocities ranging from 4,000 to 7,000 RPM for 30 seconds. In order to obtain approximately identical film thicknesses with all resist solutions, adjustments in the employed spin speed were necessary because of the variations in resist viscosities. Table II below provides the relationship between coating film thickness and spin speed for all the resist samples.

TABLE II

| Resin Composition | Spin Speed × 1000 RPM | Film Thickness | Drying Condition |
| --- | --- | --- | --- |
| Example 6 | 4.0 | 1.23 | 100/105° C., |
|  | 5.0 | 1.08 | 30' oven |
| Example 7 | 6.5 | 1.21 | 100/105° C. 30' oven |
| Example 8 | 4.0 | 1.35 | 100/105° C. |
|  | 5.0 | 1.21 | 30' oven |
|  | 7.0 | 1.02 | 30' oven |
|  | 4.0 | 1.44 | 110/118° C. |
|  | 5.0 | 1.31 | 50" Hot Plate |
| Comparison 4 | 7.0 | 1.22 | 100/105° C. 30' oven |
| Comparison 5 | 5.0 | 1.21 | 100/105° C. 30' oven |

The coated wafers were baked either in an air circulating convection Blue M oven for 30 minutes at 100°–105° C. or on a hot plate for 50 seconds at a temperature range from 110° to 118° C. The dry film thicknesses were measured with a Sloan Dektak II surface profilometer unit.

Exposure of Coated Substrates

A Perkin-Elmer projection aligner model 340 Micralign was used to provide adequate UV exposures of the above photoresist coated substrates. The spectral output of this instrument covers the range from 310 to 436 nanometers. The light intensity is monitored internally in the instrument. The scan time was varied in order to provide different exposure energies from which the resist sensitivity was determined. A Hunt resolution chromium mask containing groups of lines and spaces, isolated lines and isolated spaces varying in dimensions with minimum features of 1.25 microns.

The developed resist features were equal in their dimensions to mask features at the optimum exposure energy.

An Ultratech step and repeat 1:1 projection unit, model Ultratech 1000 with a 0.31 numerical aperture was used. This exposure tool provides a narrow spectral output of the G and H Hg lines (436–405 nm). The instrument produces high light intensity and short exposure times measured in milliseconds and controlled accurately by the instrument sensors and the shutter mechanism. Variable exposure energies were used to determine optimum resist exposure energies required to reproduce mask features. The mask used contained groups of lines and spaces, isolated lines and spaces varying in their dimensions with a minimum feature size of 0.75 microns.

At optimum exposures the exposed resist image is completely removed by an optimum developer and the image dimension is equal to the corresponding mask image dimension. Optimum developers can be different for each resist formulation. Such developers were determined by obtaining the maximum development contrast between the exposed and the unexposed resist areas where no resist film loss was detected in the unexposed resist areas.

Using the above noted mask featuring a group of equal lines and spaces allowed a quick determination of optimum resist exposure energy by microscopic examination of the developed resist images. The accuracy of determining the optimum exposure by this method is within $\pm 5$ mJ/Cm$^2$.

Development of Exposed Resist Coated Substrates

A one minute immersion development process was used to develop exposed resist coatings. Two types of developers were employed, a metal containing sodium based developer and a tetramethylammonium hydroxide based, metal ion free developer at different concentrations adjusted for each resist system. The optimum developer concentration selected for each resist provided the minimum unexposed film thickness loss of the resist coating while maximizing its development rate in the exposed areas, thus obtaining the highest development contrast for each system. The developers used and resist sensitivites are presented in Table III.

Immersion Development Process

The resist coated wafers produced and exposed according to the preceding discussions were placed on circular Teflon boats and immersed in two liter Teflon containers filled with the appropriate developer (shown in Table III) for the duration of one minute. Agitation during the development was provided by means of nitrogen bubbling distributed evenly throughout the tank. Upon removal the wafers were rinsed in distilled water for one minute and blown dry under a stream of nitrogen gas.

Table III below provides the developers employed in processing resist samples of Examples 6, 7, 8 and Comparisons 4 and 5 as well as the resulting resist sensitivities. Waycoat Positive LSI Developer ("LSI") sold by Olin Hunt Specialty Products is a metal ion containing developer and was used diluted with distilled water as indicated in Table III. The metal ion free developer Waycoat MIF Developer ("MIF") is also sold by Olin Hunt Specialty Products, was used diluted with distilled water at the concentrations indicated in Table III below.

TABLE III

| Resist | Developer Concentration | | Resist Sensitivity mJ/Cm$^2$ |
|---|---|---|---|
| | % LSI | % MIF | |
| Example 6 | 20 | | 87–94 |
| Example 7 | 28 | | 260 |
| | 39.5 | | 155 |
| | 50 | | 117 |
| | 62 | | 78 |
| | 70 | | 47–60 |
| Example 8 | 42 | | 150 |
| | | 30 | 230 |
| | | 32 | 170 |
| Comparison 4 | 70 | | 93 |
| | | 39 | 155 |

TABLE III-continued

| Resist | Developer Concentration | | Resist Sensitivity mJ/Cm$^2$ |
|---|---|---|---|
| | % LSI | % MIF | |
| Comparison 5 | 33 | | 58 |
| | | 25.5 | 71 |

Resist Image Quality & Thermal Deformation Measurements

A. Image Quality

The quality of resist images were examined after development and prior to the hard baking step. Optical microscopic examination as well as electron scan microscopy were used. The qualitative evaluation of resist images was based on the sharpness of the upper edges of resist lines and spaces, the steepness of their profiles and the smoothness of the resist image surfaces. The slope of the vertical line connecting the top edge of the resist image with its bottom edge was used to quantitatively describe the steepness of the side wall profile.

In general, low molecular weight novolaks produce better quality resist images. This was also true for the resist systems of this invention. However, resist image quality compared at both low and high molecular weight based novolaks showed better results with novolak systems of this invention over those made with corresponding comparison novolak. This comparison is provided in Tables IV and V below.

TABLE IV

| Low Molecular Weight Novolak Based Resist Systems | | | |
|---|---|---|---|
| | IMAGE QUALITY | | |
| Resist | Slope Angle | Definition of Top Edge | Surface |
| Example 6 | 89–90° | Very Sharp | Smooth |
| Comparison 5 | 85–89° | Sharp | Smooth |

TABLE V

| High Molecular Weight Novolak Based Resist Systems | | | |
|---|---|---|---|
| | IMAGE QUALITY | | |
| Resist | Slope Angle | Definition of Top Edge | Surface |
| Example 7 | | | |
| Mild developers (39.5%, 50% and 62% LSI) | 85° | Sharp | Smooth |
| Aggressive developer (70% LSI) | 85° poor | Poor | Rough |
| Example 8 | | | |
| Mild developers (42% LSI and 30% MIF) | 85–89° | Very Sharp | Smooth |
| Comparison 4 | | | |
| Mild developers (39.5%, 50% and 62% LSI) | 85° poor | Poor | Smooth |
| Aggressive developer (70% LSI) | 85° poor | Poor | Rough |

B. Thermal Deformation

The developed resist images were hard baked in a convection, air circulating Blue M oven at 130° C. for 30 minutese after which the resist images were examined for distortion and thermal flow. This examination was carried out by means of optical microscopy and scan electron microscopy. An additional 30 minutes hard bake at 150° C. was applied only to resist images showing no thermal deformation or flow after the first 130° C. hard bake.

The resist thermal image deformation was described by the rounding of the image top edges and the decrease in its profile steepness. These observations were more pronounced at the edges of large resist areas than small lines.

Resist systems based on the novolaks of this invention exhibited better resistance to thermal flow than the comparison system as shown in Table VI below.

TABLE VI

| | Thermal Image Deformation | | | |
|---|---|---|---|---|
| | 130° C. | | 150° C. | |
| RESIST | Edge Rounding | Decreased Slope | Edge Rounding | Decreased Slope |
| Example 7 | No | Slight | Yes | Yes |
| Example 8 | No | No | No | Yes |
| Comparison 4 | Yes | Yes | Yes | Yes |

What is claimed is:

1. The process of forming an positive image on a photoresist-coated substrate comprising:

(1) coating said substrate with a light-sensitive composition useful as a positive working photoresist, said composition comprising an admixture of o-quinonediazide compound and a binder resin comprising the condensation reaction of precursors comprising para-cresol, meta-cresol, formaldehyde, and a methylol-substituted trihydroxybenzophenone having formula (I):

![Formula I structure showing benzophenone with H, OH, CH2OH, OH substituents] (I)

and said binder resin containing units of formula (II):

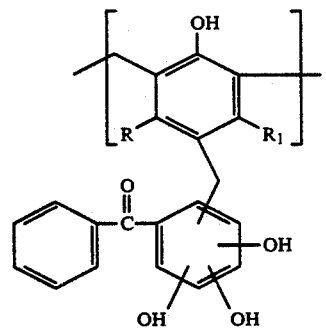

wherein the starting mole ratio of meta-cresol to para-cresol is from about 70:30 to about 30:70; wherein the starting mole ratio of said methylol-substituted trihydroxybenzophenone to the other phenolic precursors is from 0.1:99.9 to 20:80; and wherein said resin has from about 0.1% to about 30% by moles of the units of formula (II); the amount of said o-quinonediazide compound being about 5% to about 40% by weight and the amount of said binder resin being about 60% to 95% by weight, based on the total solid content of said light-sensitive composition; (2) subjecting said coating on said substrate to an image-wise exposure of radiant light energy; and (3) subjecting said image-wise exposed coated substrate to a developing solution wherein the exposed areas of said light-exposed coating are dissolved and removed from the substrate, thereby resulting in positive image-wise pattern in the coating.

2. The process of claim 1 wherein said radiant light energy is ultraviolet light.

3. The process of claim 1 wherein said developing solution comprises an aqueous solution of an alkali metal hydroxide or silicates or an aqueous solution of tetramethylammonium hydroxide.

4. The process of claim 1 wherein said units of formula (II) represent about 5% to about 10% by moles of said binder resin.

5. The process of claim 1 wherein said methylol-substituted trihydroxybenzophenone is 5-methylol-2,3,4-trihydroxybenzophenone.

6. The process of claim 1 wherein the mole ratio of the methylol-substituted trihydroxybenzophenone to the total of the other phenolic compounds is from about 5:95 to about 10:90.

7. The process of claim 1 wherein the mole ratio of formaldehyde to total phenolic compounds is less than about 1:1.

* * * * *